SIGNAL SEEKING RECEIVER

Filed April 7, 1959

INVENTOR.
JAN BLACK,
BY Noel B. Hammond
AGENT.

United States Patent Office 2,977,467
Patented Mar. 28, 1961

2,977,467

SIGNAL SEEKING RECEIVER

Jan Black, El Segundo, Calif., assignor to Hughes Aircraft Company, Culver City, Calif., a corporation of Delaware Filed Apr. 7, 1959, Ser. No. 804,722

3 Claims. (Cl. 250—20)

This invention relates to signal seeking receivers and particularly to a receiver without moving parts which will automatically tune over a predetermined frequency band and which will stop automatically when a radio signal exceeding a predetermined amplitude is received.

In the past, signal seeking receivers have utilized an electric motor for varying a tuning element such as a capacitor to tune the receiver over a predetermined frequency spectrum. Tuning of the receiver is arrested when a carrier wave of predetermined amplitude is received. However, a motor-driven signal seeking receiver has a number of disadvantages. The inertia of the motor and drive train tends to cause the receiver to tune past the frequency of a signal unless the receiver tunes at an extremely slow rate of speed. The motor and drive train is complicated, bulky and expensive; and such an arrangement is noisy in operation and consumes considerable power.

Further, motor-driven tuning arrangements cannot conveniently be arranged to remain tuned to a signal when the receiver supply voltages or the signal frequencies are not constant. When a signal seeking receiver is arranged to remain tuned to a signal by means of a closed loop automatic tuning control system, it has the undesirable tendency to vainly seek for signals when no signals are present in the band due to some external cause. This may occur, for example, in the case of an automobile receiver when the automobile is driven through a tunnel.

Accordingly, it is an object of the invention to provide a tuned circuit having a resonant frequency which may be swept over a band of frequencies electronically rather than mechanically.

It is another object of the present invention to provide a signal seeking receiver in which the tuning is accomplished electronically rather than mechanically.

Another object of the invention is the provision of a signal seeking arrangement which is simple, compact and inexpensive.

Yet another object of this invention is to provide a signal seeking arrangement which operates quietly and consumes little power.

A further object of the invention is the provision of a signal seeking receiver which will remain tuned to a signal independently of receiver supply voltage and signal frequency changes.

An even further object of the present invention is to provide a signal seeking receiver which will refrain from tuning over the frequency band when no signals are present in the band.

In accordance with these and other objects of the invention, a receiver is provided with a semiconductor diode coupled in parallel with the tuning inductor of its tuning circuit. The capacitance of the diode varies in accordance with any potential applied across it when it is biased to be nonconductive, thus causing a variation in the tuning of the receiver. A capacitor is arranged to be selectively charged from a source of potential to develop an exponential charging potential which is applied across the diode with a polarity such as to maintain the diode in a nonconductive state. The charging potential serves as a scanning or sweeping potential for causing the receiver to tune across a predetermined band of frequencies. An AGC (automatic gain control) voltage from the receiver is applied to a tuning control circuit which is arranged to control the charging current of the capacitor in accordance with the amplitude of the AGC voltage. Thus, a closed control loop is provided and the receiver will remain tuned to signals despite changes in receiver supply voltages and changes in signal frequency. A switch is provided for inactivation of the AGC control to permit tuning to an adjacent signal. A second switch is provided for discharging the capacitor to permit the receiver tuning to return to the initial frequency.

Another arrangement of a signal seeking receiver in accordance with the invention provides for inactivation of automatic tuning in the absence of signals in the predetermined frequency band. An auxiliary antenna and antenna circuit is provided which is broadly tuned to be responsive simultaneously to all signals present in the entire tuning band of the receiver. The signals received by the auxiliary antenna circuit are rectified to provide a D.C. (direct current) voltage which is applied to a diode gate coupled to the tuning control circuit. When signals are present in the band, the D.C. voltage maintains the diode gate nonconductive and tuning control circuit operates in response to the AGC voltage as described above. In the absence of signals in the frequency band, the diode gate becomes conductive and completes a path between a source of potential and the tuning control circuit which prevents further charging of the sweep capacitor. Thus, the receiver will not vainly seek for signals when no signals are present in the frequency band.

The following specification and the accompanying drawing describe and illustrate exemplifications of the present invention. Consideration of the specification and drawing will lead to an understanding of the invention, including the novel features and objects thereof. Like reference characters are used to designate like parts throughout the figures of the drawing.

Figure 1:
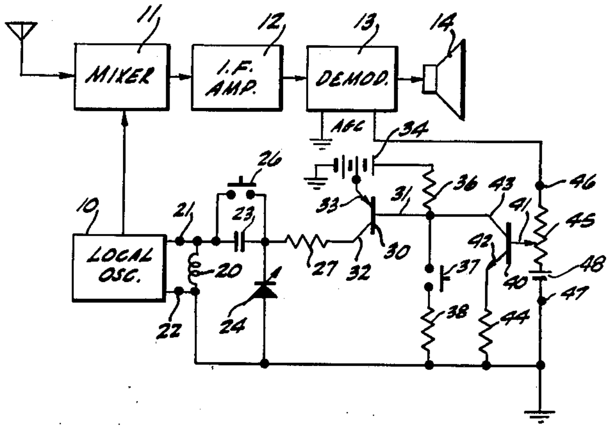
Fig. 1 is a circuit diagram, partly in block form and partly in schematic form, of a signal seeking receiver constructed in accordance with the present invention.

Referring now to Fig. 1 of the drawing, there is provided a radio receiver of the superheterodyne type which includes a local oscillator 10, a mixer 11, intermediate frequency amplifiers 12, a demodulator 13, and audio utilization apparatus 14. The local oscillator 10 includes a tuned circuit whose resonant frequency may be varied to vary the tuning of the receiver. The tuned circuit is made up of an inductor 20, which is connected into the circuit of the local oscillator 10 at a pair of terminals 21 and 22, and a silicon capacitor 24. A variable capacitance is provided by the silicon capacitor 24 in response to a control voltage.

Although any semiconductor device, such as a germanium diode, for example, may be used in this circuit, the silicon capacitor 24 is a silicon diode of the junction type which has been specifically developed and selected for its capacitance characteristics and will be found particularly satisfactory. The Hughes type HC7001 to HC7008 silicon capacitors are typical of this type of diode.

At the P–N junction of the silicon capacitor 24, the density of charge carriers (electrons in the N region and holes in the P region) is reduced substantially to zero when a voltage is applied across the junction with the opposite polarity from that causing easy current flow. As the voltage increases, the region of zero carrier density, known as the depletion region, gets wider. In effect, this moves apart the two conducting areas and decreases the capacity as if there were two metal plates separated by a dielectric whose thickness was variable. The area of the plates remains the same; the dielectric constant is unchanged; but the thickness of the dielectric varies according to the applied voltage. The leakage current of the silicon capacitor 24 is extremely small and the Q, or figure of merit, is sufficiently high so that it may be utilized in nearly all capacitor applications.

As stated previously, the silicon capacitor 24 in conjunction with the inductor 20 forms the resonant circuit of the local oscillator 10. A capacitor 23 has one end connected to the inductor 20 at the first terminal 21 and serves the purpose of blocking direct current flow from the tuning control circuit through the inductor 20. It also serves to develop an exponential charging or sweeping potential which is applied across the silicon capacitor 24. The cathode of the silicon capacitor 24 is connected to the other end of the capacitor 23 and its anode is connected to the other end of the inductor 20 at the second terminal 22. The second terminal 22 is also connected to ground.

The blocking capacitor 23 is selected to have a large value of capacitance compared to the capacitance of the silicon capacitor 24 so that the blocking capacitor 23 has little effect on the resonant frequency of the resonant circuit. On the other hand, as far as direct currents are concerned, the two capacitors 23 and 24 are in parallel. When a direct current charging path is established to the capacitors 23 and 24, the blocking capacitor 23 charges exponentially, and the exponential charging voltage across the blocking capacitor 23 is applied across the silicon capacitor 24.

A normally-open pushbutton "reset" switch 26 is connected in parallel with the blocking capacitor 23 for the purpose of discharging it when desired. To isolate the alternating currents in the tuned circuit from the tuning control circuit, a resistor 27 has one end connected to the cathode of the silicon capacitor 24. The isolation resistor 27 may have a value on the order of several megohms, or a radio frequency choke may be substituted, if desired.

The control element of the tuning control circuit is a transistor 30 of the PNP type having a base 31, a collector 32, and an emitter 33. The collector 32 is connected to the other end of the isolation resistor 27 while the emitter 33 is connected to a positive terminal of a battery 34 whose negative terminal is connected to ground. The base 31 is connected through a resistor 36 to a second positive terminal of the battery 34, the second positive terminal being more positive with respect to ground than is the first positive terminal.

The control transistor 30 appears as a variable impedance in the charging path of the blocking capacitor 23, the charging path being from the negative terminal of the battery 34 to ground, through the inductor 20 to one terminal of the capacitor 23, from the other terminal of the capacitor 23 through the isolating resistor 27 to the collector 32 of the transistor 30, and from the emitter 33 to the first positive terminal of the battery 34. It will be observed that the cathode of the silicon capacitor 24 is negative with respect to the anode, and thus it is biased to be nonconductive. A second normally open pushbutton "sweep" switch 37 is connected in series with a resistor 38 from the base 31 of the transistor 30 to ground. More precisely, one terminal of the "sweep" switch 37 is connected to the base 31, and the other terminal of the switch 37 is connected to one end of the resistor 38. The other end of the resistor 38 is connected to ground.

A second transistor 40 of the NPN type having a base 41, an emitter 42, and a collector 43 serves as an amplifier. The collector 43 of the amplifier transistor 40 is connected to the base 31 of the control transistor 30, and the emitter 42 of the amplifier transistor 40 is connected through a resistor 44 to ground. The base 41 is connected to the slider of a potentiometer 45. The outer ends of the potentiometer 45 are individually connected to a terminal 46 and the positive side of a bias source 48, respectively, the negative side of the bias source 48 being connected to another terminal 47, the terminals 46 and 47 serving as the control signal input terminals of the tuning control circuit, terminal 47 being grounded. The AGC (automatic gain control) voltage developed by the demodulator 13 of the receiver is utilized as a control signal for the tuning control circuit. Accordingly, the input terminal 46 is connected to the AGC bus of the demodulator 13. It will be understood that in the case of an FM (frequency modulation) receiver, an AFC (automatic frequency control) voltage from the discriminator may be utilized.

When the signal seeking receiver of Fig. 1 is in operation, as long as no AGC voltage is applied at the input terminals 46 and 47 of the tuning control circuit, the amplifier transistor 40 is conductive and current flows from the negative terminal of the battery 34 to ground, through the emitter resistor 44 to the emitter 42 of the amplifier transistor 40, from the collector 43, through the base resistor 36 of the control transistor 30 to the second positive terminal of the battery 34. As long as the voltage drop across the base resistor 36 is greater than the difference in potential between the two positive terminals of the battery 34, the control transistor 30 will be conductive. Accordingly, the control transistor 30 presents a low impedance in the charging path of the blocking capacitor 23 and the voltage across this capacitor 23 begins to rise. This rising voltage is applied across the silicon capacitor 24, causing its capacitance to decrease, thus causing the frequency of the local oscillator 10 to increase.

As the frequency of a radio signal is approached, the amplitude of the AGC voltage rises in a negative direction, biasing the amplifier transistor 40 to present an increasing impedance. As the impedance of the amplifier transistor 40 increases, the current through the base resistor 36 of the control transistor 30 decreases, causing the voltage drop across the base resistor 36 of the control transistor 30 to decrease. This biases the control transistor 30 to present an increasing impedance in the charging path of the blocking capacitor 23, reducing the charging current. Finally, a point is reached where the radio signal is tuned in and the control transistor 30 is substantially cut off.

However, because a closed control loop is provided, the control circuit provides sufficient charging current to balance the discharge current and leakage current. Thus, the receiver remains tuned to the signal. Should the frequency of the received signal vary or should the receiver supply voltages change, the AGC voltage will decrease, causing the tuning control circuit to increase the charging current. The adjustment of the potentiometer 45 will determine whether the receiver will lock onto weak signals. This potentiometer 45 may be referred to as a sensitivity control.

When it is desired to tune to an adjacent signal in the frequency band, the sweep switch 37 is momentarily closed causing an increase of current through the base resistor 36 of the control transistor 30 which causes the blocking capacitor 23 to continue to be charged. When the extreme end of the frequency band has been reached and it is desired to reset the receiver to the other end of the band, the reset switch 26 is momentarily closed to discharge the blocking capacitor 23. It will be understood that a thyratron or other device could be arranged to automatically discharge the capacitor 23 when the end of the band has been reached.

Figure 2:
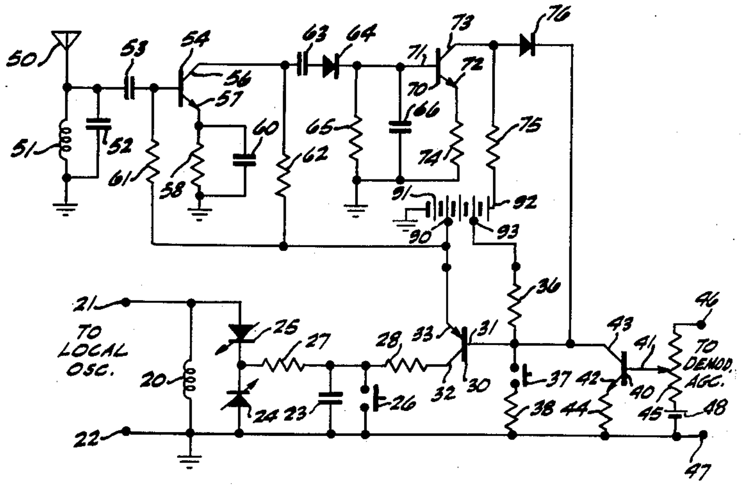
Fig. 2 is a partial circuit diagram in schematic form of another arrangement of a signal seeking receiver in accordance with the invention.

In Fig. 2 there is shown another arrangement of a tuning control circuit for use in a signal seeking receiver. In this arrangement two silicon capacitors 24 and 25 are connected in series across the tuning inductor 20 of the local oscillator 10. The two silicon capacitors 24 and 25 are polled oppositely. In the example shown, their cathodes are connected together and their anodes are connected to opposite ends of the inductor 20. This arrangement provides the same ratio of capacitance variation in the tuned circuit although the total capacitance presented by the silicon capacitors 24 and 25 is decreased to one-half. In addition, clipping of the oscillator signal is eliminated.

The isolation resistor 27 has one end connected to the cathodes of the silicon capacitors 24 and 25 and the charging capacitor 23 is connected from the other end of the isolation resistor 27 to ground. The reset switch 26 is connected in parallel with the capacitor 23. A resistor 28 is connected from the junction of the isolation resistor 27 and the charging capacitor 23 to the collector 32 of the control transistor 30. The control transistor 30 and the amplifier transistor 40 are connected as described above with reference to Fig. 1. However, additional control circuitry is provided to prevent futile hunting of the signal seeking receiver when no signals are present in the frequency band.

To this end, a separate auxiliary antenna 50 is provided which is connected to one end of a second inductor 51 whose other end is connected to ground. A tuning capacitor 52 is connected in parallel with the inductor 51. The inductor 51 and the capacitor 52 together form a broadly tuned auxiliary antenna circuit which is responsive to the entire frequency band over which the receiver is designed to be tuned.

A coupling capacitor 53 is provided to couple the antenna circuit to a third transistor 54 of the NPN type having a base 55, a collector 56, and an emitter 57, which serves as an amplifier. The coupling capacitor 53 has one terminal connected to the antenna 50 and the other terminal connected to the base 55 of the third transistor 54. The emitter 57 is connected through a biasing resistor 58 to ground and the biasing resistor 58 is bypassed for alternating signals by a bypass capacitor 60 connected in parallel with it. A resistor 61 connects the base electrode 55 of the third transistor 54 to the first positive terminal 90 of a battery 91 whose negative terminal is connected to ground A resistor 62 connects the collector 56 of the third transistor 54 to the same positive terminal 90 of the battery 91.

A coupling capacitor 63 has one end connected to the collector 56 of the third transistor 54. A diode 64 has its anode connected to the other end of the coupling capacitor 63. The cathode of the diode 64 is connected to a low pass filter composed of a resistor 65 connected in parallel with a capacitor 66. The diode 64 is connected to one end of the filter 65, 66, the other end being connected to ground. The diode 64 and filter 65, 66 demodulates the signals received by the auxiliary antenna circuit and produces an auxiliary D.C. (direct current) control voltage.

A fourth transistor 70 of the NPN type having a base 71, an emitter 72, and a collector 73, has the base 71 connected to the cathode of the diode 64. The emitter 72 is connected by a resistor 74 to ground. The collector 73 is connected by a resistor 75 to a third positive terminal 92 of the battery 91, the third terminal 92 being at a more positive potential with respect to ground than the first terminal 90 or the second terminal 93. A gating diode 76 has its anode connected to the collector 73 of the fourth transistor 70 and its cathode connected to the base 31 of the control transistor 30.

When the circuit of Fig. 2 is in operation, there will normally be signals present in the frequency band over which the receiver is designed to tune. These signals will be amplified by the third transistor 54, demodulated by the diode 64 and filtered by the low pass filter 65, 66 to develop a positive D.C. voltage between the base 71 of the fourth transistor 70 and ground. Accordingly, the fourth transistor 70 will be conductive and a current will flow from the collector 73, through the collector resistor 75 to the third positive terminal 92 of the battery 91. The voltage drop across the collector resistor 75 will bias the anode of the gating diode 76 negative with respect to its cathode, thereby making it nonconductive. Therefore, as long as signals are present in the frequency band, the tuning control circuit will operate in response to the AGC voltage, as described in conjunction with Fig. 1.

However, should there be a loss of signals over the entire band as, for example, in an automobile receiver when the automobile passes through a tunnel, both the AGC signal and the positive voltage at the base 71 of the fourth transistor 70, which is derived from the auxiliary antenna 50, will be absent. In the absence of the AGC voltage, the second transistor 40 becomes conductive and current would normally flow through the base resistor 36 of the control transistor 30, causing the receiver to begin to search for a signal. However, in the absence of the positive voltage at the base 71 of the fourth transistor 70, the transistor 70 will be substantially cutoff and the anode of the gating diode 76 will become positive with respect to its cathode. Accordingly, the gating diode 76 will become conductive and current will flow from the collector 43 of the second transistor 40 through the gating diode 76 to the battery 91. Thus, the control transistor 30 will remain cutoff and will prevent the signal seeking receiver from vainly seeking a signal.

Figure 3:
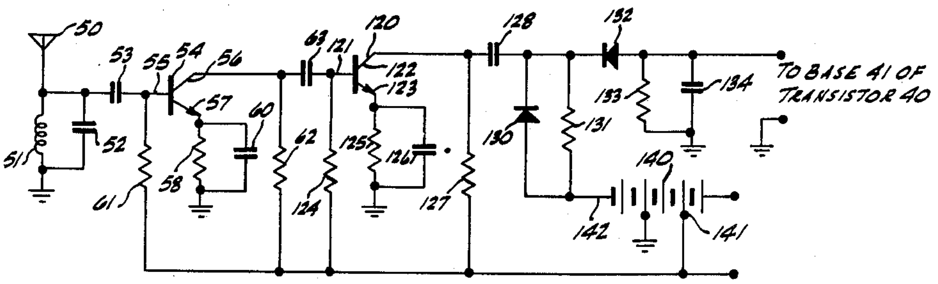
Fig. 3 is a partial circuit diagram of a third arrangement of a signal seeking receiver in accordance with the invention.

A third arrangement of control circuitry for a signal seeking receiver is shown in Fig. 3. This circuit arrangement provides an alternate way of accomplishing the prevention of vain signal seeking in the absence of signals throughout the frequency band. As in the case of the circuit of Fig. 2 a separate auxiliary antenna 50 and antenna circuit comprising an inductor 51 and a capacitor 52 is provided to respond to signals over the entire tuning band of the receiver. The antenna circuit is followed by a transistor 54 amplifier stage as in the circuit of Fig. 2. However, the coupling capacitor 63 is connected from the collector 56 of the third transistor 54 to the base 121 of a transistor 120 of the NPN type having a collector 122 and an emitter 123. The base 121 is connected by means of a resistor 124 to a positive terminal 141 of a battery 140. The emitter 123 is connected to ground by means of a resistor 125. The emitter 125 has a capacitor 126 connected in parallel with it to bypass alternating currents. The collector 122 is connected by resistor 127 to the positive terminal 141 of the battery 140. A coupling capacitor 128 has one terminal connected to the collector 122 of the transistor 120.

A diode 130 has its cathode connected to the other terminal of the capacitor 128 and the anode of the diode 130 is connected to a negative terminal 142 of the battery 140. A resistor 131 is connected in parallel with the diode 130. Another diode 132 has its cathode connected to the cathode of the first diode 130 and its anode connected to the base 41 of the second transistor 40. A resistor 133 is connected from the anode of the second diode 132 to ground and a capacitor 134 is connected in parallel with the resistor 133. The remainder of the circuit is the same as that of Fig. 2.

When the circuit of Fig. 3 is in operation, radio signals throughout the frequency band are received by the auxiliary antenna 50 and broadly tuned antenna circuit 51 and 52. The signals are amplified by the radio frequency amplifier transistors 54 and 120 and are applied between the cathode of the first diode 130 and ground. The diode 130 rectifies the signal to develop a D.C. voltage across the following resistor 131. As long as the peak signal voltage exceeds the potential between the negative terminal 142 of the battery 140 and ground, the gating diode 132 is biased to be nonconductive. However, should the signal decrease below that value, the gating diode 132 becomes conductive and current flows through the resistor 133 connected to the anode of the gating diode 132. This action applies a negative potential between the base 41 of the second transistor 40 and ground, causing the tuning control circuit to be quiescent.

Thus, there has been described a simple, compact and inexpensive signal seeking receiver in which the tuning is accomplished electronically rather than mechanically and which is quiet in operation and economical in power consumption. Further, the signal seeking receiver will remain tuned to a signal despite changes in receiver supply voltages and despite changes in signal frequency and will refrain from tuning over the frequency band when no signals are present in the band.

What is claimed is:

1. A signal seeking radio receiver for automatically tuning to an adjacent radio signal in a predetermined frequency band, the receiver comprising a tuning circuit including a semiconductor diode having a capacitance which is proportional to the potential thereacross when the diode is nonconductive, a resistor-capacitor network coupled to the diode for developing an increasing potential thereacross in response to a charging current, a source of a fixed potential, a control element coupled from the source to the network for permitting a controlled charging current to flow to the network in response to the amplitude of a control voltage, means coupled from the tuning circuit to the control element to form a closed loop for developing and applying a control voltage to the control element in response to the proximity of the receiving frequency of the receiver to the frequency of a radio signal applied to the receiver, means coupled to the control element for selectively permitting a charging current to flow to the network regardless of the amplitude of the control voltage, means coupled to the network for selectively dissipating the increasing potential developed across the diode, a fixed-tuned resonant circuit responsive to all radio signals in the predetermined frequency band, and means coupled from the fixed-tuned resonant circuit to the control element for inhibiting the controlling action of the control element in the absence of radio signals in the predetermined frequency band.

2. A fading control circuit for use with a signal seeking receiver having a frequency determining circuit including a reactive element having a reactance proportional to an applied voltage and an automatic tuning control circuit coupled to said reactive element for applying a sweeping potential thereto until a signal exceeding a certain threshold is encountered, said fading control circuit comprising a wide band signal detector for developing a control voltage indicative of the presence of signals in the tuning band of said receiver, a unilaterally conductive device coupled to said wide band signal detector, and to said tuning control circuit, and a source of potential coupled to said device, said control voltage biasing said device to be normally nonconductive and the source of potential tending to cause conduction such that when fading of all signals in the frequency band occurs said device becomes conductive and establishes a conductive path between said source of potential and said tuning control circuit, thereby inactivating the sweeping thereof.

3. A fading control circuit for a signal seeking receiver having a frequency determining circuit including a reactive element having a reactance proportional to an applied voltage and having an automatic tuning control circuit coupled to said reactive element for applying a sweeping potential thereto until a signal exceeding a certain threshold is encountered, said fading control circuit comprising an auxiliary antenna, a wide band tuned circuit coupled to said antenna, a detector coupled to said tuned circuit for rectifying signals appearing in said tuned circuit, a low pass filter coupled to said detector for developing a control voltage indicative of the presence of signals in the tuning band of said receiver, a unilaterally conductive device coupling said filter to said tuning control circuit, and a source of potential coupled to said device, said control voltage biasing said device to be normally nonconductive and the source of potential tending to cause conduction such that when fading of all signals in the frequency band occurs said device becomes conductive and establishes a conductive path between said source of potential and said tuning control circuit, thereby inactivating the sweeping thereof.

References Cited in the file of this patent

UNITED STATES PATENTS

| | | |
|---|---|---|
| 2,182,377 | Guanella | Dec. 5, 1939 |
| 2,601,384 | Goodrich | June 24, 1952 |
| 2,882,391 | Manahan | Apr. 14, 1959 |
| 2,915,625 | Worcester | Dec. 1, 1959 |

OTHER REFERENCES

"Using the Varicap" by Turner in "Radio Electronics," May 1958, pages 57–59.

"All Electronic Signal Seeking Broadcast Receiver" by Hargens in IRE Transactions on "Broadcast and Television Receivers," October 1955, pages 5–9.